(12) United States Patent
Cole et al.

(10) Patent No.: US 9,354,411 B2
(45) Date of Patent: May 31, 2016

(54) RECEIVER OPTICAL ASSEMBLIES (ROAS) HAVING PHOTO-DETECTOR REMOTELY LOCATED FROM TRANSIMPEDANCE AMPLIFIER, AND RELATED COMPONENTS, CIRCUITS, AND METHODS

(71) Applicants: Corning Optical Communications LLC, Hickory, NC (US); SILICON CREATIONS LLC., Suwanee, GA (US)

(72) Inventors: Andrew Cole, San Jose, CA (US); Brian Jeffrey Galloway, Hoschton, GA (US); Joseph Peter John Manca, Sunnyvale, CA (US); Richard Clayton Walker, Palo Alto, CA (US)

(73) Assignee: CORNING OPTICAL COMMUNICATIONS LLC, Hickory, NC (US)

( * ) Notice: Subject to any disclaimer, the term of this patent is extended or adjusted under 35 U.S.C. 154(b) by 324 days.

(21) Appl. No.: 13/790,350

(22) Filed: Mar. 8, 2013

(65) Prior Publication Data
US 2014/0112625 A1    Apr. 24, 2014

Related U.S. Application Data

(60) Provisional application No. 61/716,868, filed on Oct. 22, 2012.

(51) Int. Cl.
*G02B 6/28* (2006.01)
*G02B 6/42* (2006.01)
(Continued)

(52) U.S. Cl.
CPC .............. *G02B 6/4295* (2013.01); *H04B 10/40* (2013.01); *H04B 10/693* (2013.01); *H05K 3/30* (2013.01); *Y10T 29/49128* (2015.01)

(58) Field of Classification Search
CPC ........ H04B 10/66; H04B 10/60; H04B 10/40; G02B 6/28; G02B 6/125; G02B 6/2813
USPC ................... 385/14, 15, 24, 88, 147; 398/202
See application file for complete search history.

(56) References Cited

U.S. PATENT DOCUMENTS

| | | | |
|---|---|---|---|
| 5,046,139 A | 9/1991 | Kahn | 359/124 |
| 6,037,841 A | 3/2000 | Tanji et al. | 330/308 |

(Continued)

FOREIGN PATENT DOCUMENTS

WO    WP 93/05571    3/1993    ............... H03F 3/08

OTHER PUBLICATIONS

Patent Cooperation Treaty, International Search Report and Written Opinion for International Application No. PCT/US2013/065203; Mailing Date Feb. 12, 2014—13 pages.

(Continued)

*Primary Examiner* — Jennifer Doan

(57) ABSTRACT

Embodiments disclosed herein include receiver optical assemblies (ROAs) having a photo-detector remotely located from a differential transimpedance amplifier (TIA). Related components, circuits, and methods are also disclosed. By providing the photo-detector remotely located from a TIA, additional costs associated with design constraints of providing the photo-detector intimate with a TIA may be avoided, thereby reducing cost of the ROA. In this regard, as a non-limiting example, the ROAs according to the embodiments disclosed herein allow shorter haul active optical cable applications for use in consumer applications from a cost standpoint with the added benefits of increased bandwidth and low noise performance of optical fiber. In this regard, the ROAs disclosed herein provide higher input impedance differential TIA circuits and transmission circuits inhibiting or reducing ringing effects and maintain a sufficiently low resistance-capacitance (RC) time constant for differential TIA circuit to allow for higher bandwidth operation of the ROA.

33 Claims, 6 Drawing Sheets

(51) Int. Cl.
*H05K 3/30* (2006.01)
*H04B 10/40* (2013.01)
*H04B 10/69* (2013.01)

(56) References Cited

U.S. PATENT DOCUMENTS

| | | | |
|---|---|---|---|
| 8,391,727 B2* | 3/2013 | Steffan et al. | 398/212 |
| 8,891,975 B2* | 11/2014 | Yagisawa et al. | 398/200 |
| 2003/0193704 A1* | 10/2003 | Miremadi | 359/213 |
| 2008/0298815 A1 | 12/2008 | Khalouf et al. | 398/202 |
| 2011/0058818 A1 | 3/2011 | Karnopp et al. | 398/135 |
| 2011/0311232 A1 | 12/2011 | Morita et al. | 398/141 |
| 2012/0170944 A1 | 7/2012 | Yagisawa et al. | 398/200 |

OTHER PUBLICATIONS

Sun, et al.,"I-Gb/s 80-dBΩ fully differential CMOS transimpedance amplifier in multichip on oxide technology for optical interconnects", IEEE journal of Solid State Electronics, Jun. 2004, 3 pages.

* cited by examiner

:
RECEIVER OPTICAL ASSEMBLIES (ROAS) HAVING PHOTO-DETECTOR REMOTELY LOCATED FROM TRANSIMPEDANCE AMPLIFIER, AND RELATED COMPONENTS, CIRCUITS, AND METHODS

RELATED APPLICATIONS

This application claims the benefit of priority under 35 U.S.C. §119 of U.S. Provisional Application Ser. No. 61/716, 868 filed on Oct. 22, 2012, the content of which is relied upon and incorporated herein by reference in its entirety.

BACKGROUND

1. Field of the Disclosure

The technology of the disclosure relates to receiver optical sub-assemblies (ROSA) that receive optical signals from an optical fiber and convert the received optical signals into electrical signals.

2. Technical Background

As interconnect line speeds increase, such as five (5) to ten (10) Gigabits per second (Gbps), and beyond, active optical cables (AOCs) are increasingly being used as an alternative to traditional copper cables. Active optical cables allow electrical signals to be converted and carried as optical signals over optical fiber. Benefits of utilizing optical fiber include extremely wide bandwidth and high immunity to environmental electronic noise.

In this regard, FIG. 1 illustrates an exemplary active optical cable 10. As illustrated in FIG. 1, the active optical cable 10 includes end connectors 12A, 12B. Each end connector 12A, 12B includes electrical conductor inputs 14A configured to receive input electrical signals and electrical conductor outputs 14B configured to provide output electrical signals. Opto-electronic transceivers 16A, 16B are included in end connector housings 18A, 18B for each of the end connectors 12A, 12B, respectively. The opto-electronic transceivers 16A, 16B each include transmitter optical sub-assemblies (TOSAs) (not shown) that receive electrical input signals from the electrical conductor inputs 14A and convert the received electrical input signals into optical signals to be transmitted over optical fiber 16. The opto-electronic transceivers 16A, 16B also each include receiver optical sub-assemblies (ROSAs) (not shown) that convert the optical signals transmitted over the optical fiber 16 back into electrical signals to be provided as electrical output signals on the electrical conductor outputs 14B.

Active optical cables are commonly used in data centers to deliver voice, video, and data transmissions to subscribers over both private and public networks. For example, active optical cables can support interconnections between servers, storage area networks (SANs), and/or other equipment at data centers. At longer distances, active optical cables can be less expensive than traditional copper cables at the same distances which employ repeaters. The additional cost of the opto-electronics and optical fiber alignment components is less significant when compared to the cost of the optical fiber in the active optical cable. Also, the cost of a longer haul active optical cable can be amortized by service providers over the larger number of customers that can receive services over the active optical cable compared to the copper cable.

For shorter length active optical cable, the additional component costs contribute a greater percentage of the overall cost of the active optical cable thereby resulting in a more expensive cable over traditional copper cables having the same shorter length. Thus, active optical cables have not been typically designed for use in consumer applications at shorter lengths (e.g., consumer electronic devices, personal computers, external hard drives, digital cameras, and televisions). The higher cost of active optic cables for shorter cable distances is not perceived as providing enough value to consumers to justify the increased cost over traditional copper cables. However, consumer applications are starting to require higher bandwidths that can benefit from optical fiber cables. Thus, there is an unresolved need for short-haul active optical cables suitable for use in consumer applications that benefit from the increased bandwidth and low noise operation of optical fiber and that are commercially viable.

SUMMARY OF THE DETAILED DESCRIPTION

Embodiments disclosed herein include receiver optical assemblies (ROAs) having a photo-detector remotely located from transimpedance amplifier (TIA). Related components, circuits, and methods are also disclosed. The ROA concepts of the present application use design differences that are contrary to conventional ROSA designs for conventional long-haul applications. For instance, by providing the photo-detector remotely located from a TIA, additional costs associated with conventional design constraints of providing the photo-detector intimate with a TIA may be avoided, thereby reducing the cost of the ROA. For example, expensive bonding assembly techniques to directly connect a photo-detector to a TIA may be avoided. In this regard as a non-limiting example, the ROAs according to the embodiments disclosed herein may allow shorter haul active optical cable applications to be more readily accepted for use in consumer applications from a cost standpoint with the added benefits of increased bandwidth and low noise performance of optical fiber. To provide for a photo-detector to be remotely located from a TIA in a ROA, design constraints associated with typical receiver optical sub-assemblies (ROSA) are avoided.

In this regard in embodiments disclosed herein, a differential TIA circuit is provided with a higher TIA input impedance. The wiring connections coupling the photo-detector to the differential TIA circuit in the ROA are provided as an impedance-controlled transmission circuit. Providing a higher TIA input impedance allows the differential TIA circuit to absorb electrical signals received over the transmission circuit coupling a photo-detector to the TIA to inhibit or reduce ringing effects on the transmission circuit. Further, by providing an impedance-controlled transmission circuit coupling the photo-detector to the TIA, capacitance components of the transmission circuit can be reduced or eliminated to prevent or reduce a resistance-capacitance (RC) time constant for differential TIA circuit to allow for higher bandwidth operation. In this regard, the capacitance of the photo-detector can be designed to be the limiting capacitance factor for a low RC time constant for the differential TIA circuit for high bandwidth operation. In one non-limiting embodiment, the transmission circuit is impedance-matched or substantially impedance-matched to the TIA input impedance of the differential TIA circuit such as by using electrical traces or the like.

In this regard, in one embodiment, a receiver optical assembly (ROA) is provided. The ROA comprises a photo-detector disposed in an optical header packaging, the photo-detector configured to detect and convert input optical signals into output electrical signals. The ROA also comprises a differential transimpedance amplifier (TIA) circuit disposed in an integrated circuit remotely located from the optical header packaging. The differential TIA circuit comprises a first differential input node and a second differential input node, wherein the differential TIA circuit has a TIA input impedance of at least 10 ohms to reduce a ringing effect over the first differential input node and the second differential input node. The ROA also comprises a transmission circuit comprised of a first transmission line coupled to the first differential input node, and a second transmission line coupled to the second differential input node. A first node of the photo-detector coupled to the first transmission line and a second node of the photo-detector coupled to the second transmission line to couple the photo-detector to the differential TIA circuit to amplify the output electrical signals received from the photo-detector.

In another embodiment, a method of assembly of a ROA is provided. The method comprises disposing a photo-detector in an optical header packaging on a printed circuit board (PCB), the photo-detector configured to detect and convert input optical signals into output electrical signals. The method also comprises disposing a differential TIA circuit provided in an integrated circuit on the PCB remotely located from the optical header packaging, the differential TIA circuit comprising a first differential input node and a second differential input node, and the differential TIA circuit having a TIA input impedance of at least 10 ohms to reduce a ringing effect over the first differential input node and a second differential input node. The method also comprises disposing a transmission circuit in the PCB comprised of disposing a first transmission line as a first PCB trace in the PCB and a second transmission line as a second PCB trace in the PCB. The method also comprises coupling the first differential input node of the differential TIA circuit to the first transmission line and coupling the second differential input node of the differential TIA circuit to the second transmission line. The method also comprises coupling a first node of the photo-detector to the first transmission line and coupling a second node of the photo-detector to the second transmission line to couple the photo-detector to the differential TIA circuit to amplify the output electrical signals received from the photo-detector.

In another embodiment, another exemplary ROA is provided. The ROA comprises a photo-detector disposed in an optical header packaging, the photo-detector configured to detect and convert input optical signals into output electrical signals. The ROA also comprises a differential TIA circuit. The differential TIA circuit comprises a first TIA having a first differential input node and a first output node. The differential TIA circuit also comprises a second TIA having a second differential input node and a second output node. The ROA also comprises an output differential TIA having a first differential input node coupled to the first output node of the first TIA, and a second differential input node coupled to the second output node of the second TIA, wherein the differential TIA circuit configured to reject common noise amplified by the first TIA and the second TIA. The ROA also comprises the differential TIA circuit having a TIA input impedance of at least 10 ohms to reduce a ringing effect over the first differential input node and the second differential input node. The ROA also comprises a transmission circuit comprised of a first transmission line coupled to the first differential input node of the first TIA, and a second transmission line coupled to the second differential input node of the second TIA. A first node of the photo-detector coupled to the first transmission line and a second node of the photo-detector coupled to the second transmission line to couple the photo-detector to the differential TIA circuit to amplify the output electrical signals received from the photo-detector.

In another embodiment, a method of assembling a ROA is provided. The method comprises disposing a photo-detector in an optical header packaging on a printed circuit board (PCB), the photo-detector configured to detect and convert input optical signals into output electrical signals. The method also comprises disposing a differential transimpedance amplifier (TIA) circuit provided in an integrated circuit on the PCB remotely located from the optical header packaging. The differential TIA circuit comprises a first TIA having a first differential input node and a first output node, a second TIA having a second differential input node and a second output node, an output differential TIA having a first differential input node coupled to the first output node of the first TIA, and a second differential input node coupled to the second output node of the second TIA, the differential TIA circuit configured to reject common noise amplified by the first TIA and the second TIA. The differential TIA circuit having a TIA input impedance of at least 10 ohms to reduce a ringing effect over the first differential input node and the second differential input node. The method also comprises disposing a transmission circuit in the PCB comprised of disposing a first transmission line as a first PCB trace in the PCB and a second transmission line as a second PCB trace in the PCB. The method also comprises coupling the first differential input node of the first TIA to the first transmission line and coupling the second differential input node of the second TIA circuit to the second transmission line. The method also comprise coupling a first node of the photo-detector to the first transmission line and coupling a second node of the photo-detector to the second transmission line to couple the photo-detector to the differential TIA circuit to amplify the output electrical signals received from the photo-detector.

Additional features and advantages will be set forth in the detailed description which follows, and in part will be readily apparent to those skilled in the art from that description or recognized by practicing the embodiments as described herein, including the detailed description that follows, the claims, as well as the appended drawings.

It is to be understood that both the foregoing general description and the following detailed description present embodiments, and are intended to provide an overview or framework for understanding the nature and character of the disclosure. The accompanying drawings are included to provide a further understanding, and are incorporated into and constitute a part of this specification. The drawings illustrate various embodiments, and together with the description serve to explain the principles and operation of the concepts disclosed.

DETAILED DESCRIPTION

Figure 1:
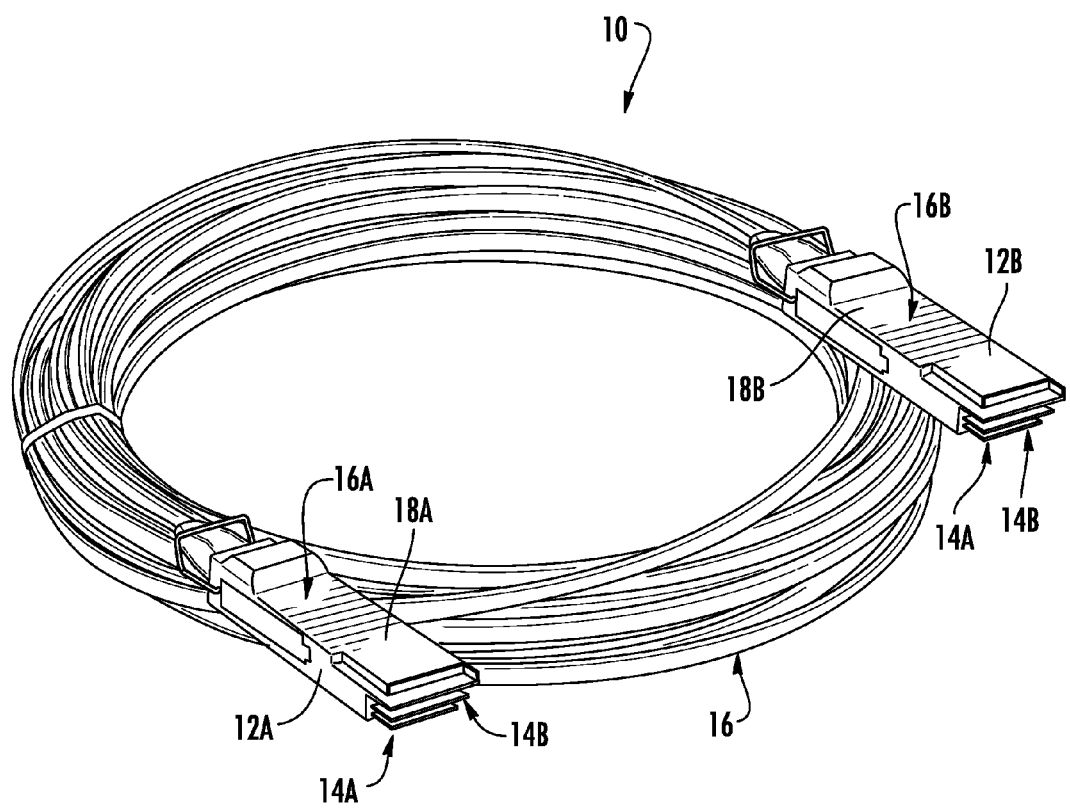
FIG. 1 is an exemplary active optical cable (AOC) that employs end connectors having electrical conductor inputs and electrical conductor outputs, electrical-to-optical (E-O) converters to convert and carry electrical input signals as optical signals over optical fiber, and optical-to-electrical (O-E) converters to convert the carried optical signals back into electrical output signals.

Reference will now be made in detail to the embodiments, examples of which are illustrated in the accompanying drawings, in which some, but not all embodiments are shown. Indeed, the concepts may be embodied in many different forms and should not be construed as limiting herein; rather, these embodiments are provided so that this disclosure will satisfy applicable legal requirements. Whenever possible, like reference numbers will be used to refer to like components or parts.

Embodiments disclosed herein include receiver optical assemblies (ROAs) having a photo-detector remotely located from transimpedance amplifier (TIA) that is suitable for short-haul applications. Related components, circuits, and methods are also disclosed. On the other hand, conventional long-haul ROSA designs have the photodiode intimately connected with the TIA and are not suitable for short-haul applications as discussed herein. By providing the photo-detector remotely located from a TIA, additional costs associated with design constraints of providing the photo-detector intimate with a TIA may be avoided, thereby reducing the cost of the ROA. For example, expensive bonding assembly techniques to directly connect a photo-detector to a TIA may be avoided. In this regard as a non-limiting example, the ROAs according to the embodiments disclosed herein may allow shorter haul active optical cable applications to be more readily accepted for use in consumer applications from a cost standpoint with the added benefits of increased bandwidth and low noise performance of optical fiber along with other features such as common mode rejection of noise. To provide for a photo-detector to be remotely located from a TIA in a ROA, conventional design constraints and practices associated with conventional receiver optical sub-assemblies (ROSA) are avoided.

In this regard in embodiments disclosed herein, a differential TIA circuit is provided with a higher TIA input impedance. Moreover, the wiring connections coupling the photo-detector to the differential TIA circuit in the ROA are provided as an impedance-controlled transmission circuit. In one non-limiting embodiment, the transmission circuit is impedance-matched or substantially impedance-matched to the TIA input impedance of the differential TIA circuit. Providing a higher TIA input impedance allows the differential TIA circuit to absorb electrical signals received over the transmission circuit coupling a photo-detector to the TIA to inhibit or reduce ringing effects on the transmission circuit. Further, by providing an impedance-controlled transmission circuit coupling the photo-detector to the TIA, capacitance components of the transmission circuit can be reduced or eliminated to inhibit or reduce a resistance-capacitance (RC) time constant for differential TIA circuit to allow for higher bandwidth operation. In this regard, the capacitance of the photo-detector can be designed to be the limiting capacitance factor for a low RC time constant for the differential TIA circuit for high bandwidth operation.

Figure 2:
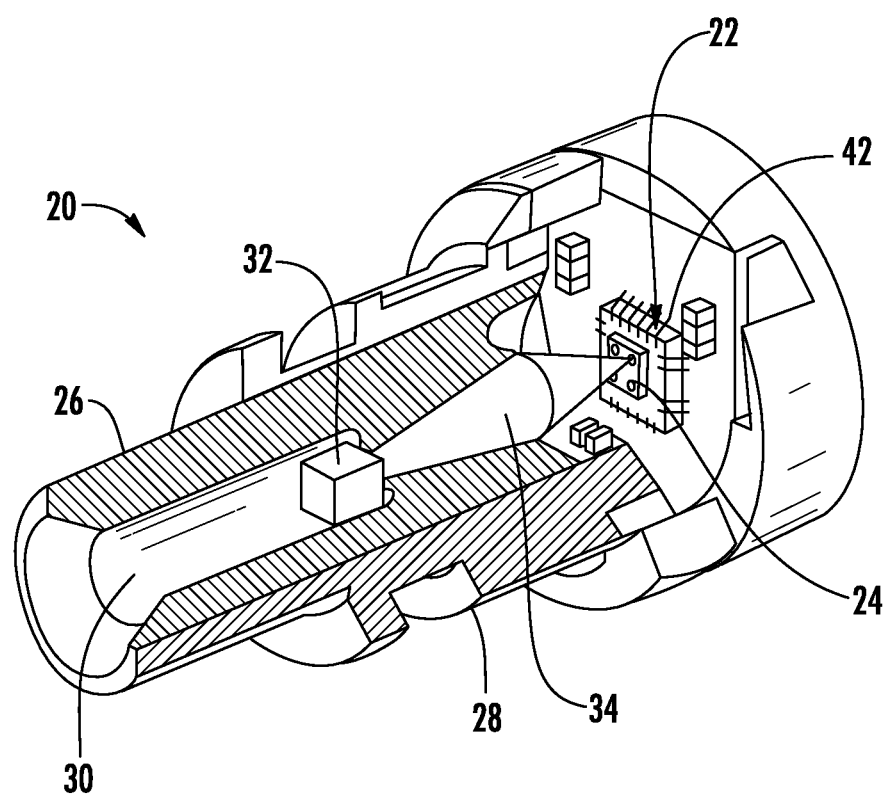
FIG. 2 is a schematic diagram of an conventional receiver optical sub-assembly (ROSA) that may be employed in the long-haul active optical cable in FIG. 1, wherein the ROSA includes a photo-detector directly attached to a transimpedance amplifier (TIA) having a low input impedance to maximize bandwidth performance and provide high TIA sensitivity to compensate for long-haul optical losses.
Figure 3:
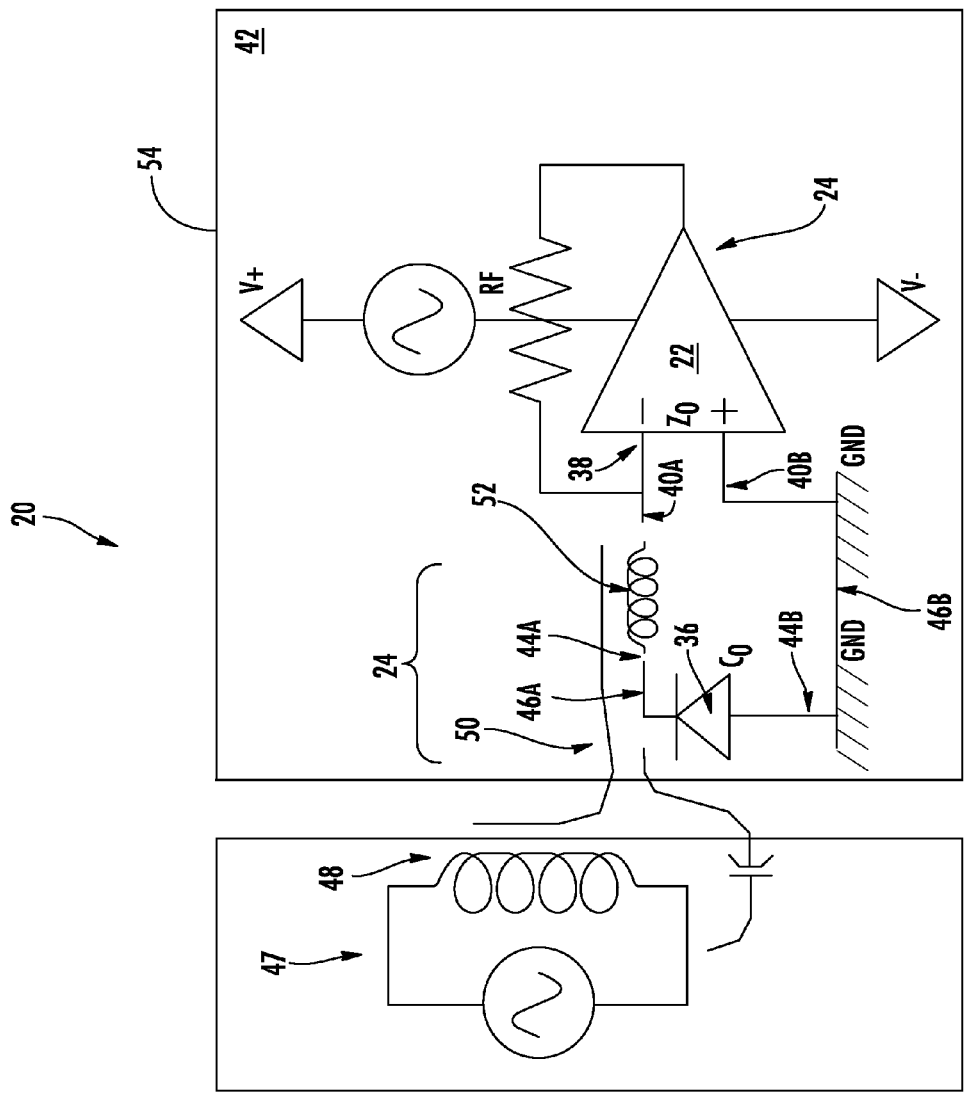
FIG. 3 is a circuit diagram of the photo-detector and TIA of the conventional ROSA in FIG. 2, wherein electrodes of the photo-detector are directly coupled to the negative input of the TIA to reduce or eliminate the effect of the photo-detector electrodes acting as current loop antennas to reduce inductively coupled noise and for high TIA sensitivity.

Before discussing the exemplary embodiments of a ROA that includes a photo-detector remotely located from a higher input impedance TIA via impedance-controlled transmission lines, a conventional receiver optical subassembly (ROSA) designed for long-haul communications in the prior art is first discussed with regard to FIGS. 2 and 3. The discussion of the ROSA in FIGS. 2 and 3 is to illustrate typical ROSA design constraints that are cost problematic for use in shorter haul active optical cables, and which are addressed by embodiments of the present disclosure. For example, shorter haul cables may be less than 100 meters as a non-limiting example, but other short lengths are also possible.

In this regard, FIG. 2 is a schematic diagram of a conventional receiver optical sub-assembly (ROSA) 20. An example of the conventional ROSA 20 that is designed for long-haul optical fiber, including the active optical cable 10 in FIG. 1, is disclosed in U.S. Pat. No. 7,160,039. The conventional ROSA 20 may be employed in the active optical cable 10 in FIG. 1. As will be discussed in more detail below, the conventional ROSA 20 includes a transimpedance amplifier (TIA) 22 with a low input impedance and a photo-detector 24 directly mounted to the TIA 22 to reduce input capacitance for high bandwidth performance and to reduce or eliminate the TIA 22 amplifying extraneous noise. FIG. 3 is an exemplary circuit diagram of the photo-detector 24 of the conventional ROSA 20 in FIG. 2. The conventional ROSA 20 of FIG. 2 and the circuit diagram of the exemplary TIA 22 and photo-detector 24 of the conventional ROSA 20 in FIG. 3 will be described in conjunction below.

The conventional ROSA 20 in FIGS. 2 and 3 is designed for use in long-haul optical signal transmissions to provide for high bandwidth operation and high TIA 22 sensitivity while minimizing amplification of extraneous noise. With reference to FIG. 2, the conventional ROSA 20 is provided as part of a fiber optic connector 26. The fiber optic connector 26 includes a housing 28 that includes a bore 30. The bore 30 is configured to receive a fiber optic ferrule (not shown) disposed on an end of an optical fiber (not shown) for receiving input optical signals to be converted to output electrical signals. An optical insert 32 is provided in the bore 30. The optical insert 32 is configured to be optically connected to the optical fiber of the fiber optic ferrule inserted into the bore 30. The input optical signals received from the optical fiber are refracted by the optical insert 32 as a beam of light 34 directed to the photo-detector 24. For example, as illustrated in the circuit diagram of FIG. 3, the photo-detector 24 is a reverse-biased photodiode 36 which responds to an incident optical signal by generating an electrical output current signal with an alternative current (AC) and direct current (DC) component. As is well known, the TIA 22 converts the current input signals from the photodiode 36 at a negative input node 38 of the TIA 22 to voltage output signals having gain that is a function of the value of the feedback resistor $R_F$ (e.g., 1000 ohms to provide a $10^3$ gain of a 1 milliAmp (mA) signal to 1 Volt (V)).

With reference to the circuit diagram in FIG. 3, the TIA 22 of the conventional ROSA 20 is provided with the lowest possible input impedance $Z_0$ (e.g., one (1) to ten (10) ohms) so that the negative input node 38 of the TIA 22 is in essence short circuited to the ground node GND. Thus, the input impedance $Z_O$ is in parallel with the photodiode 36. The capacitance $C_O$ of the photodiode 36, which may be as little as a few pico Farads (pF), is disposed in parallel with the input impedance $Z_O$ of the TIA 22. This allows high bandwidth operation of the TIA 22 when converting input optical signals to output electrical signals in the conventional ROSA 20, because at the negative input node 38, which is the critical node for current measurement speed by the TIA 22, the low input impedance of the TIA 22 provides a low impedance $Z_O$ capacitance $C_O$ ($Z_O C_O$) time constant. Providing a low $Z_O C_O$ time constant allows the TIA 22 to measure current at the negative input node 38 faster, thus providing higher bandwidth operation and capability for the conventional ROSA 20. If the TIA 22 is not provided with a low input impedance $Z_O$, the capacitance $C_O$ of the photodiode 36 may only allow MegaHertz (MHz) of bandwidth operation as opposed to GigaHertz (GHz) operation, which is desired for active optical cables applications.

To provide a high TIA 22 sensitivity in conventional designs, the photodiode 36 of the photo-detector 24 is located as close as possible to the TIA 22. Thus, with continuing reference to FIG. 3, electrical input contacts 40A, 40B on a mounting surface of an integrated circuit (IC) chip 42 of the TIA 22 are directly connected to corresponding electrodes 44A, 44B of the photo-detector 24. For example, this direct connection may be provided via direct bonding using bond wires, or with the use of solder bumps in a flip chip bonding process. This allows shorter length connection wires 46A, 46B or other bonds between the electrodes 44A, 44B of the photodiode 36, and the electrical input contacts 40A, 40B of the TIA 22. In this manner, the shorter length connection wires 46A, 46B do not act as current loop antennas, and thus receive and couple outside RF radio signals and other extraneous noise that would otherwise be amplified by the highly sensitive TIA 22 and reduce performance.

For example, a switching power supply 47 powering the TIA 22 may have magnetic GHz noise components from an inductor 48 that are more readily coupled by a representative flux line 50 into an interconnect inductance 52 of a longer length connection wire 46A. The GHz noise components of the switching power supply prevent the use of switching power supply 47 with the ROA 20 in this embodiment without impacting the bandwidth performance of the ROA 20. As illustrated in FIG. 3, the photo-detector 24 is provided as part of the common packaging 54. The conventional ROSA 20 may also be hermetically sealed and RF shielded to eliminate or reduce the connection wires 46A, 46B and electrodes 44A, 44B of the photodiode 36 coupling to outside RF radio signals and other inductive noise to allow for high TIA 22 sensitivity.

Thus, in summary, to maximize bandwidth performance of the conventional ROSA 20 in FIGS. 2 and 3 designed for long-haul optical signal transmissions, the TIA 22 should be designed with the lowest possible input impedance $Z_O$. The conventional ROSA 20 design makes no attempt to control impedance. The input impedance $Z_O$ is not impedance-matched to the impedance of the electrodes 44A, 44B of the photo-detector 24 so that the bandwidth performance of the TIA 22 is directly a function of capacitance $C_O$ of the photodiode 36 present at the negative input node 38 of the TIA 22. Providing low input TIA 22 impedance provides a low $Z_O C_O$ time constant that allows the TIA 22 to measure current at the negative input node 38 faster, thus providing higher bandwidth operation for the conventional ROSA 20. It is also desired to provide high TIA 22 sensitivity to compensate for the optical signal losses by providing a short length connection between the electrodes 44A, 42B of the photodiode 36, and the electrical input contacts 40A, 40B of the TIA 22. In this manner, the electrodes 44A, 44B of the photodiode 36 in conventional designs do not act as current loop antennas to receive and couple outside RF radio signals and other inductive noise that is amplified by the highly sensitive TIA 22.

On the other hand, there is an unresolved need for shorter haul active optical cables so consumer applications and the like can enjoy the benefit of increased bandwidth and low noise operation of optical fiber. But even with the increased bandwidth and low noise operation of active optical cables, the higher cost of active optic cable components, including a conventional ROSA design, may not provide enough enhanced value to certain consumers to justify the increased cost for shorter cable lengths compared with high-speed copper cables. Thus, the conventional ROSA design employed in the conventional ROSA 20 of FIGS. 2 and 3 may be cost prohibitive for use in shorter haul active optical cables. For example, the conventional ROSA 20 in FIGS. 2 and 3 may require expensive bonding assembly techniques to directly connect the photo-detector 24 to the TIA 22 over short length connections. Expensive flip chip bonding may be used, which may require ceramic carriers. Expensive wire bonding assembly techniques, such as the use of meshed wiring, may be employed.

Further, the conventional ROSA 20 in FIGS. 2 and 3 also requires expensive packaging for hermetic sealing and RF shielding of the photo-detector 24 and the TIA 22. For example, expensive gold plated graft blocks with sapphire substrates and microwave transitions may be employed. The hermetic sealing and RF shielding must also be provided for the entire common packaging 54, because the photo-detector 24 and the TIA 22 must be closely located to each other to provide high TIA 22 sensitivity, as discussed above. The common packaging 54 must also be sufficiently sized to house both the TIA 22 and the photo-detector 24, and may have to provide a lid to allow separate access to the TIA 22 and the photo-detector 24 during assembly and/or testing. The common packaging 54 must also provide for the ability to receive and align optical fibers to the photo-detector 24 while still maintaining hermetic sealing and RF shielding. This can require expensive, precision manufacturing of the common packaging 54 thereby increasing the cost of the conventional ROSA 20.

On the other hand, short-haul active optical cables will need to have costs that are comparable with high-speed electrical cables at least for short lengths. If the cost of the ROSA in short-haul active optical cables can be reduced, the overall cost of short-haul active optical cables can be reduced, thereby making shorter haul active optical cables more readily accepted for use in consumer applications and the like with the added benefits of increased bandwidth and low noise performance.

Figure 4:
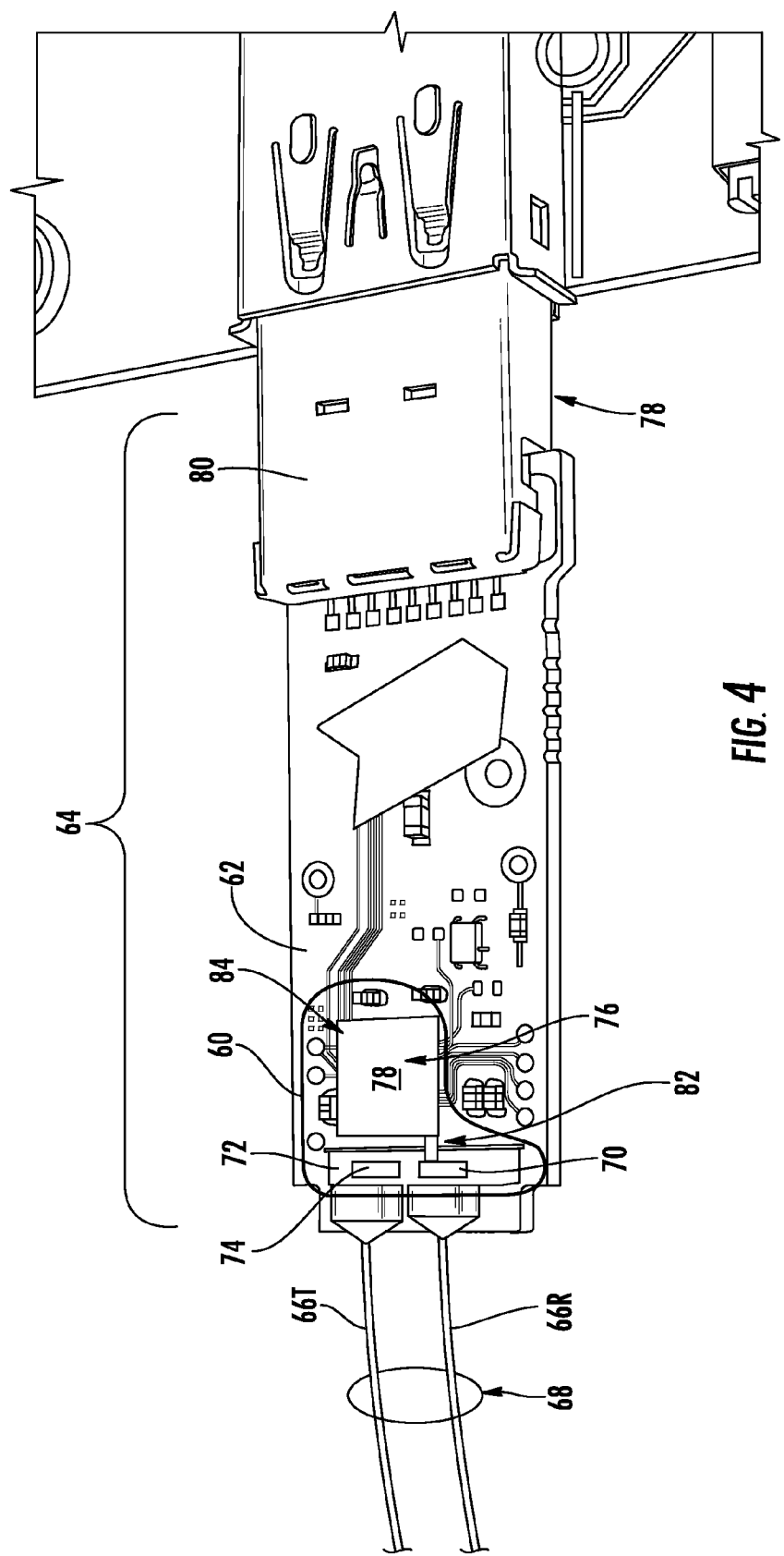
FIG. 4 is a diagram of an exemplary receiver optical assembly (ROA) disposed on a printed circuit board (PCB) as part of an exemplary universal serial bus (USB) connector that can be employed in an active optical cable, wherein the ROA includes a photo-detector remotely located from and coupled to a higher input impedance TIA via impedance-controlled transmission lines.
Figure 5:
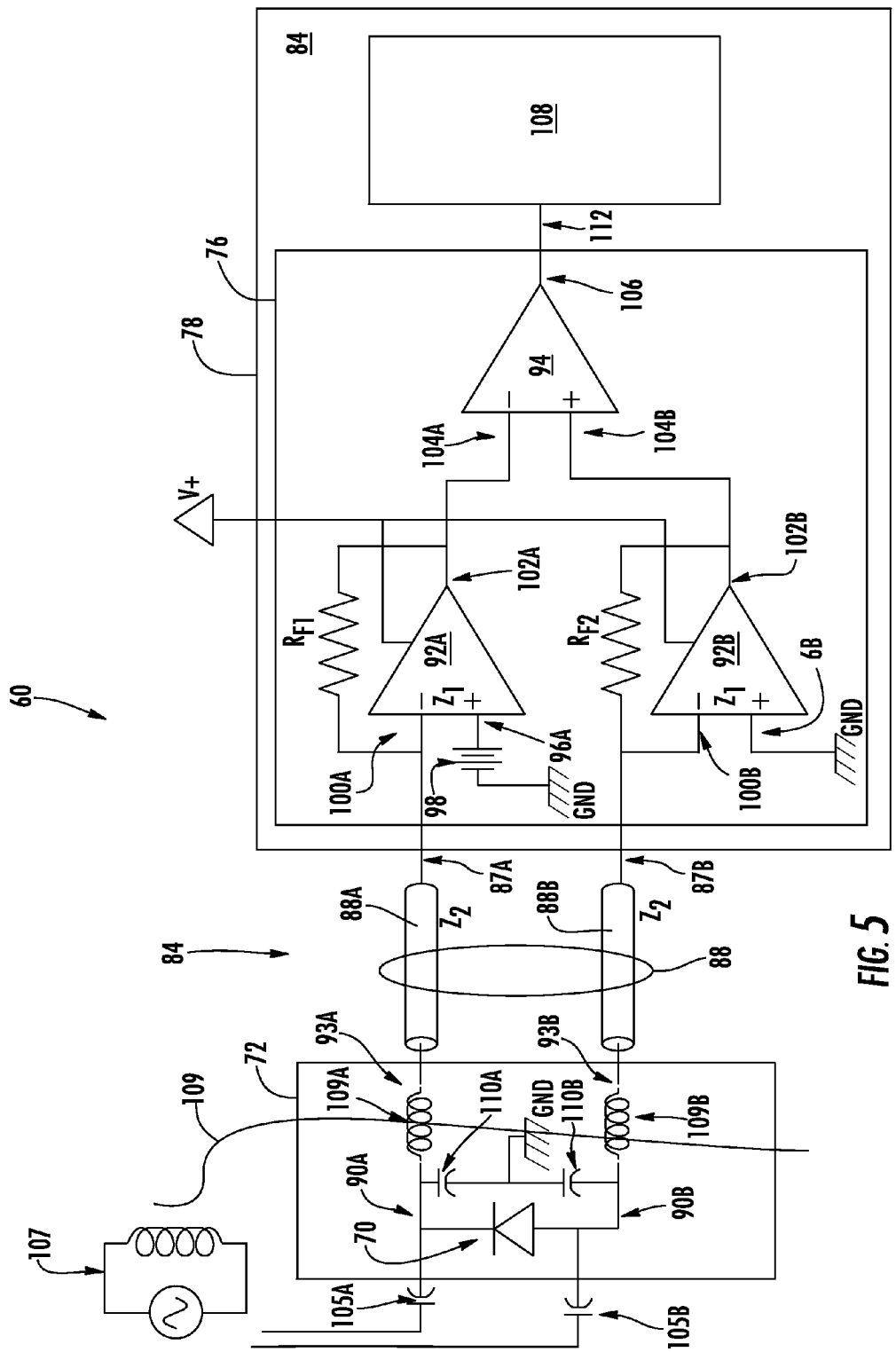
FIG. 5 is a circuit diagram of the ROA of FIG. 4 employing a photo-detector remotely located from a higher input impedance TIA via impedance-controlled transmission lines.

FIGS. 4 and 5 describe one such ROA suitable for use in short-haul applications such as about 100 meters or less. In this regard, FIG. 4 is a diagram of an exemplary receiver optical assembly (ROA) 60 disposed on a printed circuit board (PCB) 62 as part of an assembly for an exemplary universal serial bus (USB) connector 64. The ROA 60 can be employed in an active optical cable for providing optical fiber transmission over a receiver optical fiber 66R and a transmitter optical fiber 66T of an active optical fiber USB cable 68. The active optical fiber USB cable 68 in FIG. 4 is a shorter length cable, such as between one (1) and one hundred (100) meters (m), as non-limiting examples. The ROA 60 includes a photodiode 70 disposed in an optical header packaging 72. The optical header packaging 72 can be any enclosure or packaging desired to house the photodiode 70. The optical header packaging 72 may be hermetically sealed and include conductor pins for interfacing with the components disposed in the optical header packaging 72, including the photodiode 70. As a non-limiting example, the optical header packaging 72 may include a small plastic-molded lead frame package. As another example, the optical header packaging 72 could include a PCB disposed on its side using metallic castellations on the side of the PCB to provide surface mount solder connections.

With continuing reference to FIG. 4, the optical header packaging 72 in this embodiment also includes a laser 74 configured to transmit output optical signals converted from input electrical signals over the transmitter optical fiber 66T. In this embodiment, the photodiode 70 is provided separately and apart from the differential TIA circuit 76. The photodiode 70 in the optical header packaging 72 is remotely located from a higher input impedance differential TIA circuit 76 disposed in a protocol chip 78 such as an integrated circuit (IC) chip. By remotely located, it is meant that the photodiode 70 and the differential TIA circuit 76 are not provided in the same packaging, nor bonded directly together. Thus, there is no transimpedance amplifier included in the optical header packaging 76 on purpose and by design for the reasons previously discussed above. In other words, the TIA circuit is remotely located from the optical header packaging. The optical header packaging 72 is entirely passive in this embodiment and serves to turn the laser 74 and photodiode 70 at right angles to the PCB 62 to make it possible to butt-couple the optical fibers 66T, 66R into the active areas of the PCB 62.

With continuing reference to FIG. 4, the photodiode 70 in the optical header packaging 72 is remotely located from a higher input impedance differential TIA circuit 76 disposed in a protocol chip 78 to reduce the cost of the ROA 60. In this manner, two separate IC chips—one for the differential TIA circuit 76 and a separate IC chip for a protocol chip 78 are not required. The differential TIA circuit 76 can be provided in the protocol chip 78 to reduce the number of IC chips and reduce cost of the ROA 60. In other words, all active components except for the ROA 60 and laser 74 may be provided in the single protocol chip 78 (e.g. a complementary metal-oxide semiconductor (CMOS chip)) to reduce cost of the assembly. The protocol chip 78 in this embodiment includes the necessary circuitry to transmit and receive electrical signals to and from USB pins (not shown) in a USB connector sheath 80 according to a USB protocol. Note that the concepts used with protocol chip 78 are not limited to USB protocol, but may be used with other suitable protocol chips as desired.

With continuing reference to FIG. 4, because the photodiode 70 is provided apart and separate from the differential TIA circuit 76 in the protocol chip 78, the additional costs associated with the design constraints of the conventional ROSA 20 in FIGS. 2 and 3 may be avoided for the ROA 60. For example, expensive bonding assembly techniques to directly connect the photodiode 70 to the differential TIA circuit 76 over short length connections can be avoided. However, as will be discussed in more detail below, the wiring connections 82 coupling the photodiode 70 and the differential TIA circuit 76 in the protocol chip 78 will be longer, because the coupling transitions between the optical header packaging 72 and the protocol chip 78 are located separately and remotely from each other. For example, the wiring connections 82 coupling the photodiode 70 and the differential TIA circuit 76 in the protocol chip 78 may be approximately one (1) millimeter (mm) in length, which is considered remotely located for high-speed data transmission. The photodiode 70 does not have to be included in hermetically sealed and a protocol chip packaging 84 for the protocol chip 78. For example, providing the photodiode 70 in a separate packaging from the differential TIA circuit 76 can allow a low cost injection-molded plastic packaging to be used as the protocol chip packaging 84. Thus, the protocol chip packaging 84 does not have to provide for the ability to receive and align the optical fibers 66T, 66R to the photodiode 70 while still maintaining hermetic sealing and RF shielding. The protocol chip packaging 84 can be composed of a material or structure to provide RF shielding. Further, the protocol chip packaging 84 does not have to be sufficiently sized to house both the differential TIA circuit 76 and the photo-detector 70. The ROA 60 in FIG. 4 also allows the photodiode 70 to be separately accessed during assembly and/or testing without having to access or open the protocol chip packaging 84.

Most of the design considerations and techniques employed in the conventional ROSA 20 in FIGS. 2 and 3 are avoided in the ROA 60 of FIG. 4 and a new design logic is used. For example, if the differential TIA circuit 76 in the ROA 60 of FIG. 4 were provided with a low input impedance as provided in the TIA 22 of the conventional ROSA 20, several issues would result. First, the longer wiring connections 82 coupling the separate optical header packaging 72 and the protocol chip 78 would increase the capacitance on the wiring connections 82 and coupled to the input of the differential TIA circuit 76, thus increasing the resistance-capacitance (RC) time constant and decreasing bandwidth performance of the ROA 60. Second, if the differential TIA circuit 76 has a low input impedance, the electrical current transmitted from the photodiode 70 over the wiring connections 82 to the differential TIA circuit 76 will reflect back on the wiring connections 82 back to the photodiode 70 and back to the differential TIA circuit 76 and so on providing a ringing effect on the wiring connections 82, thereby decreasing bandwidth performance. By way of example, electrical signal pulses may bounce back and forth between the photodiode 70 and the differential TIA circuit 76 ten (10) to fifteen (15) times and provide undesirable ringing.

Thus in summary, design considerations and techniques involved around providing a low input impedance TIA 22 in the conventional ROSA 20 in FIGS. 2 and 3 are not suitable for the ROA 60 of FIG. 4. The cost reductions realized from providing the photodiode 70 remotely located from the differential TIA circuit 76 in the protocol chip 78 may not justify the decreased bandwidth performance if the design considerations and techniques involved in the conventional ROSA 20 in FIGS. 2 and 3 are employed in the ROA 60 of FIG. 4.

To address the issues of increased capacitance and electrical signal ringing over the wiring connections 82, an alternative circuit is provided for the photodiode 70 and differential TIA circuit 76. In this regard, FIG. 5 is an exemplary circuit that can be provided in the ROA 60 of FIG. 4 to take into consideration the photodiode 70 being remotely located from the differential TIA circuit 76 in the protocol chip 78 while minimizing the impact on bandwidth performance. In the ROA 60 in FIG. 5, as will discussed in more detail below, the differential TIA circuit 76 is provided with a higher TIA input impedance $Z_1$ than input impedance $Z_0$ of the TIA 22 in the conventional ROSA 20 of FIGS. 2 and 3. The higher TIA input impedance $Z_1$ is provided for the differential TIA circuit 76 to allow the differential TIA circuit 76 to absorb the electrical signals and inhibit or reduce ringing on the wiring connections 86.

Also, the wiring connections 86 coupling the photodiode 70 to the differential TIA circuit 76 in the ROA 60 are provided as an impedance-controlled transmission circuit 88. As will also be discussed in more detail below, the impedance-controlled transmission circuit 88 in this embodiment is comprised of a first transmission line 88A and a second transmission line 88B to provide a coupling to the nodes of the photodiode 70 and to provide common mode rejection of noise. The transmission lines 88A, 88B each have a transmission impedance $Z_2$. In this manner, the capacitance component of the transmission lines 88A, 88B is reduced or eliminated to inhibit or reduce the transmission lines 88 to allow longer wiring connections 86 for providing the photodiode 70 remotely from the differential TIA circuit 76 while providing a RC time constant of the differential TIA circuit 76 that allows for higher bandwidth operation of the differential TIA circuit 76. Any capacitance component of the transmission lines 88A, 88B is in addition to the capacitance $C_1$ of the photodiode 70 as part of the RC time constant of the differential TIA circuit 76.

Figure 6:
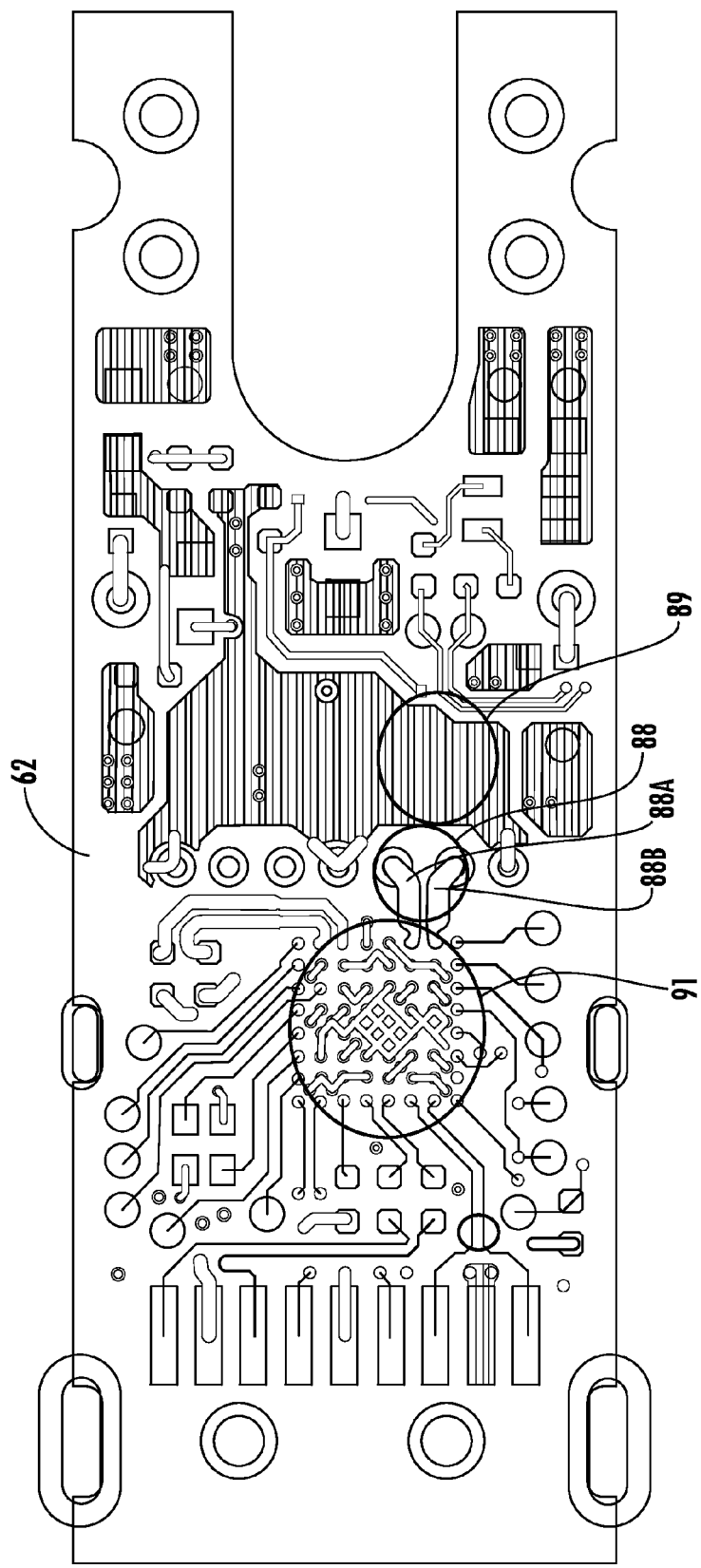
FIG. 6 is a schematic diagram a close-up view of the PCB for the ROA in FIG. 4 illustrating the PCB metallization pattern to support photo-detector pads remotely located from and coupled to TIA pads via PCB trace transmission lines.

In this example, the transmission lines 88A, 88B are provided to have an impedance of thirty-five (35) ohms. In one embodiment, the transmission lines 88A, 88B are implemented on a PCB, such that a range of transmission impedances $Z_2$ that can be supported by the PCB are feasible by using electrical traces with a predetermined impedances such as based on size or the like. For example, the transmission lines 88A, 88B can be fabricated on the PCB 62 in FIG. 4 to provide a desired transmission impedance $Z_2$ between ten (10) and two hundred (200) ohms as a non-limiting example. In one specific embodiment, the transmission impedances $Z_2$ such as at least ten (10) ohms. An example of providing the transmission lines 88A, 88B is illustrated in FIG. 6 as a close-up view of the PCB 62 for the ROA 60 in FIG. 4. There, the pads 89 for the photodiode 70 and the pads 91 for the protocol chip 78 are remotely located from each other and are coupled via the transmission lines 88A, 88B provided as PCB traces in the PCB 62. For example, the photodiode 70 may be located at least 0.1 mm or approximately 0.1 mm away from the TIA circuit 76 in the protocol chip 78. Inductive and capacitive components may be provided along transmission lines 88A, 88B to control the impedance and reduce or eliminate capacitance to provide a low RC time constant for high bandwidth operation such as 5 Gbps or greater. In one embodiment, the transmission impedance $Z_2$ of the transmission lines 88A, 88B are also impedance-matched or substantially impedance-matched to the higher TIA input impedance $Z_1$ of differential TIA circuit 76 to provide for maximum energy transfer between the photodiode 70 and the differential TIA circuit 76. Substantial impedance-matching may provide that the transmission impedance $Z_2$ of the transmission lines 88A, 88B are within fifty percent (50%) of the TIA input impedance $Z_1$ of differential TIA circuit 76, or vice versa. Impedance matching minimizes any ringing on the transmission lines 88A, 88B. The TIA input impedance $Z_1$ of the differential TIA circuit 76 can also be designed to optimize the amount of optical power received from the photodiode 70, which may allow the need for an optical attenuator, which is conventional in low input impedance TIA designs in ROSAs.

By providing a higher TIA input impedance $Z_1$ in the differential TIA circuit 76, it may be desired to further reduce the RC time constant of the differential TIA circuit 76 to increase bandwidth performance of the ROA 60. In this regard, the size of the active region photodiode 70 can be selected to be smaller in size to minimize the capacitance $C_1$ of the photodiode 70. As a non-limiting example, the capacitance $C_1$ of the photodiode 70 may be between 0.6 picoFarads (pf) (i.e., at TIA input impedance $Z_1$ of 50 ohms and data rate at 10 Gpbs). Providing a smaller photodiode 70 provides a smaller cone for reception of input optical signals received over the receiver optical fiber 66R (see FIG. 4) and thus less received optical power to be converted into electrical signals.

As a non-limiting example, the aperture of the photodiode 70 may be sized to vary from approximately one hundred (100) μm down to approximately fifty (50) μm down or twenty-five (25) μm for an eighty (80) μm optical fiber core. For example, the optical power output by the photodiode 70 may be 0.27 mA as a non-limiting example. But, less optical power conversion may be acceptable for the ROA 60 when employed in a short haul active optical fiber USB cable 68 or the like. In a short haul active optical fiber USB cable 68, there may not be an appreciable optical loss over the receiver optical fiber 66R. Thus, the signal-to-noise (S/N) ratio of the electrical signals provided by the photodiode 70 may still be acceptable for the ROA 60.

With continuing reference to FIG. 5, the differential TIA circuit 76 is a differential TIA having two differential input nodes 87A, 87B each coupled to a transmission line among the transmission lines 88A, 88B. The transmission lines 88A, 88B are each coupled to a respective node 90A, 90B of the photodiode 70 remotely located from the differential TIA circuit 76. Bond wires 93A, 93B may be employed to connect the nodes 90A, 90B of the photodiode 70 to the transmission lines 88A, 88B. Also in this embodiment, the differential TIA circuit 76 comprises two single-ended input TIAs 92A, 92B driving an output differential amplifier 94. The TIA 92B has its positive input terminal 96B connected to ground GND and TIA 92A has its positive input terminal 96A connected to power source 98, thereby placing the potential of the power source 98 across the photodiode 70. The negative input terminals 100A, 100B of the TIAs 92A, 92B are coupled to the photodiode 70 via the differential input nodes 87A, 87B connected to the transmissions lines 88A, 88B to put the photodiode 70 in a reverse bias operation to reduce intrinsic capacitance of the photodiode 70 to minimize the RC time constant of the TIAs 92A, 92B.

With continuing reference to FIG. 5, the transimpedance gains of the TIAs 92A, 92B are respectively set by the feedback resistors $R_{F1}$, $R_{F2}$, respectively. The TIA input impedances $Z_1$ at the negative input terminals 100A, 100B of the TIAs 92A, 92B, respectively, are set by the feedback resistors $R_{F1}$, $R_{F2}$, respectively and the amplifier gain for the frequency characteristics of the TIAs 92A, 92B and the frequency of the input electrical signals. In one embodiment, the input TIA impedances $Z_1$ of the TIAs 92A, 92B are impedance-matched or substantially impedance-matched to the transmission impedances $Z_2$ of the transmissions lines 88A, 88B. This reduces or inhibits ringing on the transmission lines 88A, 88B between the TIAs 92A, 92B and the photodiode 70 from causing pulse distortion.

With continuing reference to FIG. 5, the output nodes 102A, 102B are coupled as inputs to differential input nodes 104A, 104B to the output differential amplifier 94 to produce an output electrical signal on a differential TIA output node 106 representing the electrical signal representation of the received input optical signals by the photodiode 70. Environmental noise induced on the transmission lines 88A, 88B will cancel each other or substantially cancel each other in the output differential amplifier 94 through common mode rejection. This allows the differential TIA circuit 76 to be highly noise immune and be in close proximity to other noise circuits in the ROA 60 if needed or desired. For example, environmental noise can result from parasitic capacitances 105A, 105B coupled from a power source 107, which may be a switching power supply, to the photodiode 70. The conventional ROSA 20 in FIGS. 2 and 3, which does not employ common mode rejection, may not be able to be employed in a package or active optical cable containing a switching power supply. As another example, magnetic fields 109 provided by current in the power source 107 can be inductively coupled to the transmission lines 88A, 88B acting as antennas. The common mode rejection of the differential TIA circuit 76 may allow use of a switching power supply with the ROA 60, which may otherwise not be possible without degrading bandwidth performance. As another example, noise may be inserted into the ROA 60 from the transmission lines 88A, 88B receiving extraneous RF signals.

With continuing reference to FIG. 5, providing differential amplifiers in the differential TIA circuit 76 is acceptable for the ROA 60, because even with the added noise floor (e.g., +3 dB) of the two TIAs 92A, 92B, the short haul application of the ROA 60 provides lower loss and sufficient optical power level. This circuit feature of providing differential amplifiers in the differential TIA circuit 76 with common mode rejection can also save costs for the ROA 60, because the photodiode 70 and at least a portion of the transmission lines 88A, 88B that do not extend into the protocol chip packaging 84 do not have to be RF shielded to be immune or substantially immune to extraneous RF signal noise. The differential amplifier arrangement in the differential TIA circuit 76 allows more noise to be present on the transmission lines 88A, 88B because of the common mode rejection performed by the differential TIA circuit 76 without requiring additional components or features in the ROA 60 to reduce extraneous induced noise, such as RF shielding for example. The output electrical signal provided on the differential TIA output node 106 by the output differential amplifier 94 is provided to an input node 112 of a protocol circuit 108 that can be configured to convert the output electrical signal generated by the output differential amplifier 94 on the differential TIA output node 106 into the desired protocol (e.g., USB).

In summary, the TIAs 92A, 92B are provided to have a fixed TIA input impedance $Z_1$, which is not provided on conventional ROSA 20 in FIGS. 2 and 3 or other ROSAs. TIAs for ROSAs are typically designed for low input impedance to provide the lowest possible input RC time constant in conjunction with a photodiode capacitance. With the ROA 60 of FIG. 5, these conventional design features are purposefully disregarded and unconventional wisdom is used for the benefit of short haul active optical cables as one application example. The low input impedance is sacrificed by providing a higher, fixed TIA input impedance $Z_1$, which is preferably impedance-matched to the transmission impedance $Z_2$ of the transmission lines 88A, 88B, to remotely locate the photodiode 70 from the TIAs 92A, 92B as discussed above. To further reduce the effect of parasitic bond-wire inductances 109A, 109B that may be present in transmission lines 88A, 88B to further reduce the RC time constant, compensating capacitors 110A, 110B may be provided as illustrated in FIG. 5. The capacitance of the compensating capacitors 110A, 110B substantially equals the parasitic inductances 109A, 109B divided by the TIA 92A, 92B input impedance. Also note that a compensating inductor(s) can be provided in the ROA 60 in FIG. 5 to offset or reduce capacitance in the transmission lines 88A, 88B. Also note that either inductances or capacitances of the transmission lines 88A, 88B may be modified to compensate for excess capacitance or inductances to attempt to impedance-match the transmission impedance $Z_2$ with TIA input impedance $Z_1$, or otherwise provide the desired impedance of the transmission impedance $Z_2$.

With continuing reference to FIG. 5, the components of the ROA 60 can be physically arranged such that capacitive coupling from any voltage source inside an active optical cable in which the ROA 60 is disposed, including power source 107, is substantially balanced, such that induced voltages amplified by TIAs 92A, 92B are cancelled by output differential amplifier 94. Similarly, inductive flux sources, including power supply 107, can be located in an active optical cable including the ROA 60 such that the magnetic flux 109 is substantially balanced to the bond wires 93A, 93B such that induced currents as amplified by TIAs 92A, 92B are cancelled by output differential amplifier 94. The TIAs 92A, 92B may also be internally constructed to be identical or substantially identical such that any noise from the power supply 107 induced in the ROA 60, produce identical or substantially identical signals on the output nodes 102A, 102B to be cancelled or substantially cancelled by the output differential amplifier 94.

Many modifications and other embodiments of the embodiments set forth herein will come to mind to one skilled in the art to which the embodiments pertain having the benefit of the teachings presented in the foregoing descriptions and the associated drawings. Therefore, it is to be understood that the description and claims are not to be limited to the specific embodiments disclosed and that modifications and other embodiments are intended to be included within the scope of the appended claims. It is intended that the embodiments cover the modifications and variations of the embodiments provided they come within the scope of the appended claims and their equivalents. Although specific terms are employed herein, they are used in a generic and descriptive sense only and not for purposes of limitation.

We claim:

1. A receiver optical assembly (ROA), comprising:
   a photo-detector disposed in an optical header packaging, the photo-detector configured to detect and convert input optical signals into output electrical signals;
   a differential transimpedance amplifier (TIA) circuit disposed in an integrated circuit (IC) chip remotely located from the optical header packaging, the differential TIA circuit comprising a first differential input node and a second differential input node, and the differential TIA circuit having a TIA input impedance of at least 10 ohms to reduce a ringing effect over the first differential input node and the second differential input node;
   a transmission circuit comprised of a first transmission line coupled to the first differential input node, and a second transmission line coupled to the second differential input node;
   a first node of the photo-detector coupled to the first transmission line and a second node of the photo-detector coupled to the second transmission line to couple the photo-detector to the differential TIA circuit to amplify the output electrical signals received from the photo-detector; and
   a protocol circuit disposed in the integrated circuit (IC) chip, the protocol circuit comprising an input node coupled to an output signal node of the differential TIA circuit.

2. The ROA of claim 1, wherein the differential transimpedance amplifier (TIA) circuit is remotely located from the photo-detector by at least approximately 1.0 millimeter (mm).

3. The ROA of claim 1, wherein the TIA input impedance of the differential TIA circuit is approximately 35 ohms.

4. The ROA of claim 1, wherein the TIA input impedance of the differential TIA circuit is between approximately ten (10) ohms and two hundred (200) ohms.

5. The ROA of claim 1, wherein a transmission impedance of the transmission circuit is impedance matched or substantially impedance-matched to the TIA input impedance of the differential TIA circuit.

6. The ROA of claim 1 disposed on a printed circuit board (PCB), wherein the transmission circuit is provided as at least one PCB trace disposed in the PCB.

7. The ROA of claim 1, wherein the photo-detector is comprised of a photodiode.

8. The ROA of claim 1, further comprising at least one compensating capacitor coupled to at least one of the first node and the second node of the photo-detector to reduce parasitic inductance of the photo-detector.

9. The ROA of claim 1, further comprising at least one compensating inductor coupled to at least one of the first node and the second node of the photo-detector to reduce parasitic capacitance of the photo-detector.

10. The ROA of claim 1, wherein the differential TIA circuit further comprises:
   a first TIA containing the first differential input node coupled to the first transmission line, and
   a second TIA containing the second differential input node coupled to the second transmission line.

11. The ROA of claim 10, wherein the output differential TIA circuit further comprises an output differential TIA having a first differential input node coupled to a first output node of the first TIA, and a second differential input node coupled to a second output node of the second TIA, the differential TIA circuit configured to reject common noise amplified by the first TIA and the second TIA.

12. The ROA of claim 1, further comprising a RF shield shielding differential TIA circuit.

13. The ROA of claim 1, wherein the optical header packaging and at least a portion of the transmission circuit are not RF shielded.

14. The ROA of claim 1, wherein the optical header packaging does not include a transimpedance amplifier.

15. The ROA of claim 1 disposed in an active optical cable assembly of an active optical cable.

16. The ROA of claim 15, wherein the active optical cable is no longer than one hundred (100) meters (m).

17. The ROA of claim 15, wherein the active optical cable assembly further comprises a switching power supply configured to supply power to the differential TIA amplifier circuit.

18. A method of assembly of a receiver optical assembly (ROA), comprising:
   disposing a photo-detector in an optical header packaging on a printed circuit board (PCB), the photo-detector configured to detect and convert input optical signals into output electrical signals;
   disposing a differential transimpedance amplifier (TIA) circuit and a protocol circuit provided in an integrated circuit (IC) chip on the PCB remotely located from the optical header packaging, the differential TIA circuit comprising a first differential input node and a second differential input node, and the differential TIA circuit having a TIA input impedance of at least 10 ohms to reduce a ringing effect over the first differential input node and a second differential input node, and the protocol circuit comprising an input node coupled to an output signal node of the differential TIA circuit;
   disposing a transmission circuit in the PCB comprised of disposing a first transmission line as a first PCB trace in the PCB and a second transmission line as a second PCB trace in the PCB;
   coupling the first differential input node of the differential TIA circuit to the first transmission line and coupling the second differential input node of the differential TIA circuit to the second transmission line; and
   coupling a first node of the photo-detector to the first transmission line and coupling a second node of the photo-detector to the second transmission line to couple the photo-detector to the differential TIA circuit to amplify the output electrical signals received from the photo-detector.

19. The method of claim 18, comprising impedance matching or substantially impedance matching the TIA input impedance with a transmission impedance of the transmission circuit.

20. The method of claim 18, further comprising not RF shielding the optical header packaging.

21. The method of claim 18, further comprising not providing a transimpedance amplifier in the optical header packaging.

22. A receiver optical assembly (ROA), comprising:
   a photo-detector disposed in an optical header packaging, the photo-detector configured to detect and convert input optical signals into output electrical signals;
   a differential transimpedance amplifier (TIA) circuit comprising:
      a first TIA having a first differential input node and a first output node;
      a second TIA having a second differential input node and a second output node; and
      an output differential TIA having a first differential input node coupled to the first output node of the first TIA, and a second differential input node coupled to the second output node of the second TIA, the differential TIA circuit configured to reject common noise amplified by the first TIA and the second TIA;
   the differential TIA circuit having a TIA input impedance of at least 10 ohms to reduce a ringing effect over the first differential input node and the second differential input node;
   a transmission circuit comprised of a first transmission line coupled to the first differential input node of the first TIA, and a second transmission line coupled to the second differential input node of the second TIA;
   a first node of the photo-detector coupled to the first transmission line and a second node of the photo-detector coupled to the second transmission line to couple the photo-detector to the differential TIA circuit to amplify the output electrical signals received from the photo-detector; and
   a protocol circuit disposed in an integrated circuit (IC) chip, the protocol circuit comprising an input node coupled to an output signal node of the differential TIA circuit.

23. The ROA of claim 22, wherein the TIA input impedance of the differential TIA circuit is approximately 35 ohms.

24. The ROA of claim 22, wherein the TIA input impedance of the differential TIA circuit is between approximately ten (10) ohms and two hundred (200) ohms.

25. The ROA of claim 22, wherein a transmission impedance of the transmission circuit is impedance matched or substantially impedance-matched to the TIA input impedance of the differential TIA circuit.

26. The ROA of claim 22, wherein the optical header packaging and at least a portion of the transmission circuit are not RF shielded.

27. The ROA of claim 22, further comprising not providing a transimpedance amplifier in the optical header packaging.

28. The ROA of claim 22 disposed in an active optical cable assembly of an active optical cable.

29. The ROA of claim 28, wherein the active optical cable assembly further comprises a switching power supply configured to supply power to the differential TIA amplifier circuit.

30. A method of assembling a receiver optical assembly (ROA), comprising:
- disposing a photo-detector in an optical header packaging on a printed circuit board (PCB), the photo-detector configured to detect and convert input optical signals into output electrical signals;
- disposing a differential transimpedance amplifier (TIA) circuit provided in an integrated circuit on the PCB remotely located from the optical header packaging, the differential TIA circuit comprising:
  - a first TIA having a first differential input node and a first output node;
  - a second TIA having a second differential input node and a second output node; and
  - an output differential TIA having a first differential input node coupled to the first output node of the first TIA, and a second differential input node coupled to the second output node of the second TIA, the differential TIA circuit configured to reject common noise amplified by the first TIA and the second TIA;
- the differential TIA circuit having a TIA input impedance of at least 10 ohms to reduce a ringing effect over the first differential input node and the second differential input node; and
- disposing a transmission circuit in the PCB comprised of disposing a first transmission line as a first PCB trace in the PCB and a second transmission line as a second PCB trace in the PCB;
- coupling the first differential input node of the first TIA to the first transmission line and coupling the second differential input node of the second TIA circuit to the second transmission line;
- coupling a first node of the photo-detector to the first transmission line and coupling a second node of the photo-detector to the second transmission line to couple the photo-detector to the differential TIA circuit to amplify the output electrical signals received from the photo-detector; and
- disposing a protocol circuit in an integrated circuit (IC) chip on the PCB, and coupling an input node of the protocol chip to an output signal node of the differential TIA circuit.

31. The method of claim 30, further comprising impedance matching or substantially impedance-matching the transmission impedance of the transmission circuit to the TIA input impedance of the differential TIA circuit.

32. The method of claim 30, further comprising not RF shielding the optical header packaging.

33. The method of claim 30, further comprising not providing a transimpedance amplifier in the optical header packaging.

* * * * *